(12) United States Patent
Afleck et al.

(10) Patent No.: US 7,698,673 B2
(45) Date of Patent: Apr. 13, 2010

(54) CIRCUIT AND CIRCUIT DESIGN METHOD

(75) Inventors: Steven Ray Afleck, Fort Collins, CO (US); Reid James Riedlinger, Wellington, CO (US); Douglas Shelborn Stirrett, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 149 days.

(21) Appl. No.: 10/940,703

(22) Filed: Sep. 14, 2004

(65) Prior Publication Data

US 2006/0055428 A1 Mar. 16, 2006

(51) Int. Cl.
G06F 9/45 (2006.01)
G06F 17/50 (2006.01)
(52) U.S. Cl. .......................................................... 716/6
(58) Field of Classification Search ................. 716/5–6, 716/10, 1
See application file for complete search history.

(56) References Cited

U.S. PATENT DOCUMENTS

| | | | | |
|---|---|---|---|---|
| 5,097,149 | A * | 3/1992 | Lee ............................. | 326/87 |
| 5,453,709 | A * | 9/1995 | Tanimoto et al. ............ | 327/276 |
| 5,629,634 | A * | 5/1997 | Carl et al. .................... | 326/27 |
| 6,060,910 | A | 5/2000 | Inui | |
| 6,384,654 | B1 * | 5/2002 | Noufer ........................ | 327/276 |
| 6,407,585 | B1 * | 6/2002 | Vinh ........................... | 326/98 |
| 6,411,140 | B1 * | 6/2002 | Landry ........................ | 327/141 |
| 6,643,828 | B2 | 11/2003 | Naffziger et al. | |
| 2002/0008559 | A1 * | 1/2002 | Krishnamurthy et al. .... | 327/206 |
| 2003/0115560 | A1 | 6/2003 | Naffziger et al. | |
| 2004/0125661 | A1 * | 7/2004 | Cioaca ........................ | 365/189.05 |
| 2004/0135597 | A1 * | 7/2004 | Seike ........................... | 326/87 |
| 2005/0093610 | A1 * | 5/2005 | Park ............................. | 327/377 |

OTHER PUBLICATIONS

IEEE; The Authoritative Dictionary of IEEE Standards Terms; 2000; 7th edition; pp. 559, 1047.*

Hongyan Yan, et al., "A High-Speed CMOS Dual-Phase Dynamic-Pseudo NMOS ((DP)2) Latch and Its Application in a Dual-Modulus Prescaler", IEEE Journal of Solid-State Circuits, vol. 34, Oct. 10, 1999, pp. 1400-1404.

Richard B. Brown, "Robust Low-Leakage Circuits", Kevin Nowka Exploratory VLSI, IBM Austin Research Laboratory, nowka@us.ibm.com, (date unknown).

Richard B. Brown, "Mitigation of CMOS Gate Leakage", Department of Electrical Engineering and Computer Science University of Michigan, Ann Arbor, MI, http://www.eecs.umich.edu/brown, (date unknown).

Article entitled "Dynamic Logic", http://www.csee.umbc.edu/plusquel/vlsiII/slides/combo_logic4.html, date printed Apr. 30, 2004, pp. 1-17.

(Continued)

Primary Examiner—Jack Chiang
Assistant Examiner—Suresh Memula

(57) ABSTRACT

One disclosed embodiment may comprise a design method for a dynamic circuit system. The method may include providing a design for a single stage network comprising a pull-down network that is configured to perform a desired logic function according to a plurality of inputs. The method may also include designing a multi-stage network that includes at least two stages, each of the at least two stages including a pull-down network that receives a respective portion of the plurality of inputs and each of the at least two stages cooperating to perform the desired logic function.

13 Claims, 6 Drawing Sheets

OTHER PUBLICATIONS

Dr. -Ing. Peter Glosekotter, "Pseudo Dynamic Gate Design Based on the Resonant Tunneling-Bipolar Transistor (RTBT)", Universitat Dortmund, Fakultat Elektrotechnik und Informationstechnik, Sep. 2002.

Paper by Katarzyna Radecka, "Pseudo-NMOS and Dynamic Devices, Digital Electronics, COEN315 Winter", e-mail: kasiar@ece.concordia.ca, Room: GM: 809-19, (date unknown).

* cited by examiner

CIRCUIT AND CIRCUIT DESIGN METHOD

BACKGROUND

With integrated circuit (IC) technology being scaled to ever smaller dimensions to achieve higher performance and integration levels, power dissipation has become an important consideration in modern VLSI (very large scale integrated) circuit designs. In one type of circuit design, for example, sets of transistors (e.g., field effect transistors (FETs)) are arranged in a pull-down and pull-up relationship, such as for implementing dynamic circuits that perform logic functions.

As transistor sizes scale down in such circuits, however, there tends to be increased leakage through pull-down transistors. The pull-down network includes transistors arranged to pull an output node from a first voltage to a second, lower voltage. A pull-up network is designed to maintain the output node at the first voltage by compensating for the leakage through the pull-down network. The increased leakage through the pull-down network generally requires an increase in the size of the pull-up transistor(s), which results in increased power consumption and reduced operating performance.

SUMMARY

One embodiment of the present invention may comprise a design method for a dynamic circuit system. The method may include providing a design for a single stage network comprising a pull-down network that is configured to perform a desired logic function according to a plurality of inputs. The method may also include designing a multi-stage network that includes at least two stages, each of the at least two stages including a pull-down network that receives a respective portion of the plurality of inputs and each of the at least two stages cooperating to perform the desired logic function.

Another embodiment may comprise a method for designing a pseudo dynamic circuit. The method includes providing a design of a single stage pseudo dynamic system that includes a pull-up network coupled to an output node and a pull-down network coupled to the output node. The pull-down network is configured to perform a logic function and provide an output according to a plurality of inputs. A first stage of a multi-stage pseudo dynamic system is designed to include a first pull-down network configured to provide a corresponding output at an output node thereof based on a first portion of the plurality of inputs. A pull-up network is designed to compensate for leakage associated with the pull-down network of the first stage, such that a ratio of size for the pull-up network of at least the first stage to size of the pull-down network of the at least the first stage is reduced relative to a ratio of size for the pull-up network of the single stage network to size of the pull-down network of the single stage network. A second stage of the multi-stage pseudo dynamic system is designed to include a second pull-down network configured to provide a corresponding output at an output node thereof based on the output at the output node of the first stage and a second portion of the plurality of inputs, such that the output of the second stage corresponds to the output of the single stage-pseudo-dynamic system.

Yet another embodiment may comprise a multi-stage dynamic circuit system that includes a first stage. The first stage includes a pull-up network coupled to pull-up a first node to a high voltage level, and a pull-down network coupled to pull-down the first node to a low voltage level. A second stage includes a pull-down network coupled to pull-down a second node to a low voltage level. A buffer is coupled between the first node and the second node. The system also includes a plurality of inputs, a first subset of the plurality of inputs being provided to the pull-down network of the first stage and a second subset of the plurality of inputs being provided to the pull-down network of the second stage, such that the pull-down network of the first stage and the pull-down network of the second stage cooperate to perform a logic function according to the plurality of inputs.

Still another embodiment may comprise a system for designing a circuit. The system includes means for providing a design of a single stage pseudo dynamic system that includes a pull-up network coupled to an output node and a pull-down network coupled to the output node. The pull-down network is designed to perform a logic function and provide an output according to a plurality of inputs. The system also includes means for designing a first stage of a multi-stage pseudo dynamic system that includes a first pull-down network designed to provide a corresponding output at an output node thereof based on a first portion of the plurality of inputs. The system also includes means for designing a pull-up network to compensate for leakage associated with the pull-down network of the first stage, such that a ratio of size for the pull-up network of at least the first stage to size of the pull-down network of the at least the first stage is reduced relative to a ratio of size for the pull-up network of the single stage network to size of the pull-down network of the single stage network. The system further includes means for designing a second stage of the multi-stage pseudo dynamic system that includes a second pull-down network designed to provide a corresponding output at an output node thereof based on the output at the output node of the first stage and a second portion of the plurality of inputs, such that the output of the second stage corresponds to the output of the single stage-pseudo-dynamic system.

DETAILED DESCRIPTION

Figure 1:
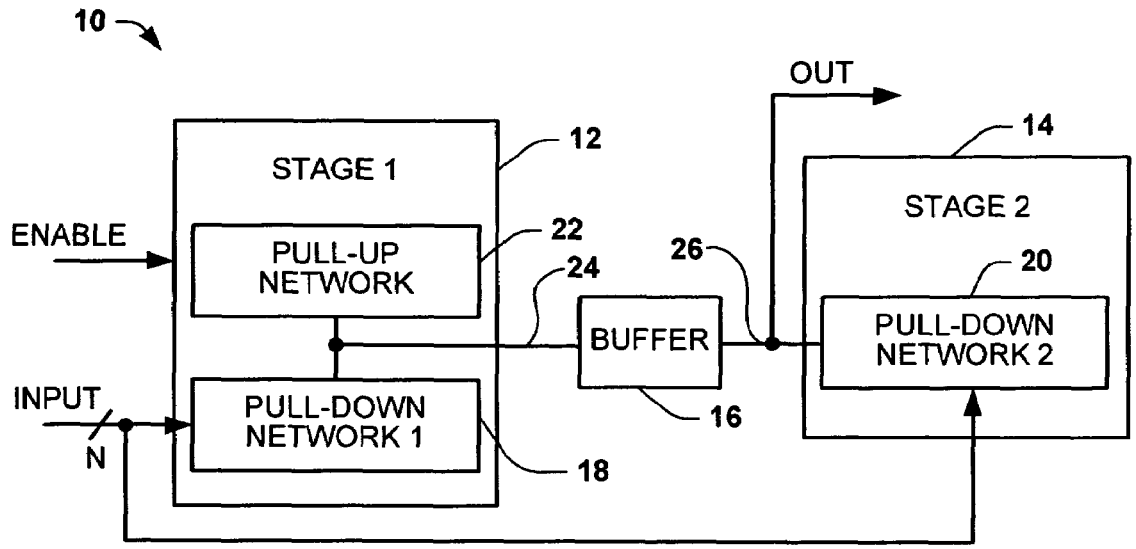
FIG. 1 depicts a schematic block diagram of an embodiment of a multi-stage pseudo dynamic circuit.

FIG. 1 depicts an example of a multi-stage pseudo dynamic circuit 10. The circuit 10 includes a first stage 12 coupled to a second stage 14 through a buffer 16 to perform a function according to given set of N inputs, where N is a positive integer greater than or equal to 2. The set of N inputs defines an aggregate INPUT that is divided into corresponding subsets of inputs, which subsets are provided to the respective stages 12 and 14. The respective stages 12 and 14 cooperate to perform the function (e.g., combinational logic, such as including a wide OR function or wide NOR function) of an equivalent single-stage circuit, but with reduced power compared to the equivalent single stage circuit. Additionally, despite the increased number of transistors that may be utilized to implement the multi-stage circuit 10, the multi-stage circuit can exhibit an increased performance relative to an equivalent single stage circuit since smaller, faster components (e.g., transistors) can be utilized in one or both of the stages 12 and 14 of the multi-stage circuit.

Each of the first stage 12 and second stage 14 includes an associated pull-down network 18 and 20, respectively. The respective pull-down networks 18 and 20 each includes a portion of a pull-down network design to implement a desired function such as a logical OR or NOR function, which is typically implemented in an equivalent single-stage circuit. That is, the corresponding subsets of the N inputs are provided as inputs to each of the pull-down networks 18 and 20.

At least the first stage 12 of the circuit 10 also includes a corresponding pull-up network 22. The pull-up network 22 is sized to maintain an output node 24 at a high voltage level. As transistors scale down to implement the circuit 10, however, there will be an increased amount of leakage through the pull-down network. Accordingly, the pull-up network 22 is sized to maintain the voltage at the node 24 to compensate for leakage through the pull-down network 18.

Those skilled in the art will understand and appreciate that, since each of the stages 12 and 14 includes a corresponding pull-down network 18 and 20 that corresponds to a respective portion of a pull-down network of an equivalent single-stage circuit, a significantly smaller pull-up network 22 can be utilized in the first stage 12 than in the equivalent single stage circuit. Stated differently, a ratio (or percentage) of the size for components (e.g., PFETs) that form the pull-up network 22 to the size of the pull-down network 18 in at least the first stage (or both pull-down networks 18 and 20) is reduced relative to a ratio of the size for components in the pull-up network to the size of the pull-down network of the equivalent single stage network. By utilizing a smaller pull-up network 22 in the first stage 12, performance of the circuit 10 can be improved and operate faster than the comparable equivalent single-stage circuit. Additionally, since the node 24 is coupled to the second stage 14 of the circuit 10 through the buffer 16, there can be an additional power savings since activation and powering of the second stage 14 can be controlled as a function of the portion of the input signals provided to the pull-down network 18 of the first stage 12. That is, leakage power through the pull-down network 20 is mitigated in the absence of activation of the pull-down network by the first stage 12.

An ENABLE signal can be provided to the first stage 12 of the circuit 10 to activate and deactivate the first stage. The ENABLE signal can be provided, for example, to operate the first stage 12 in the active condition, such as by causing the pull-up network 22 to pull an output node 24 of the first stage 12 to a high voltage level. If the ENABLE signal is provided so as to deactivate the first stage 12, the second stage 14 will also be deactivated regardless of the N input signals provided to the respective pull-down networks 18 and 20. The deactivation of the second stage 14 results from transferring the output signal (e.g., pulled low via the ENABLE signal) through the buffer 16 to an output node 26 of the second stage 14.

The buffer 16 can be tuned to operate as a high speed buffer that provides the signal at node 24 as an input to the second stage 14 of the circuit 10. For example, the buffer 16 can be implemented as a series of one or more inverters or pass gates configured to provide the signal at node 24 to the node 26 associated with the second stage 14. When the second stage 14 is enabled (e.g., through activation of the first stage 12), the second subset of the INPUT signals is provided to control the pull-down network 20 and, in turn, provide a corresponding OUT signal at the node 26. Accordingly, as mentioned above, the combination of pull-down networks 18 and 20 cooperate to implement a logic function, such as combinational logic, based on the aggregate N input signals provided to the respective pull-down networks 18 and 20. Additionally, the performance of the dynamic circuit 10 can be improved due to the use of the small pull-up network 22, which is sized to the mitigate the leakage power associated with the pull-down network 18, and is not affected by leakage associated with pull-down network 20.

Figure 2:
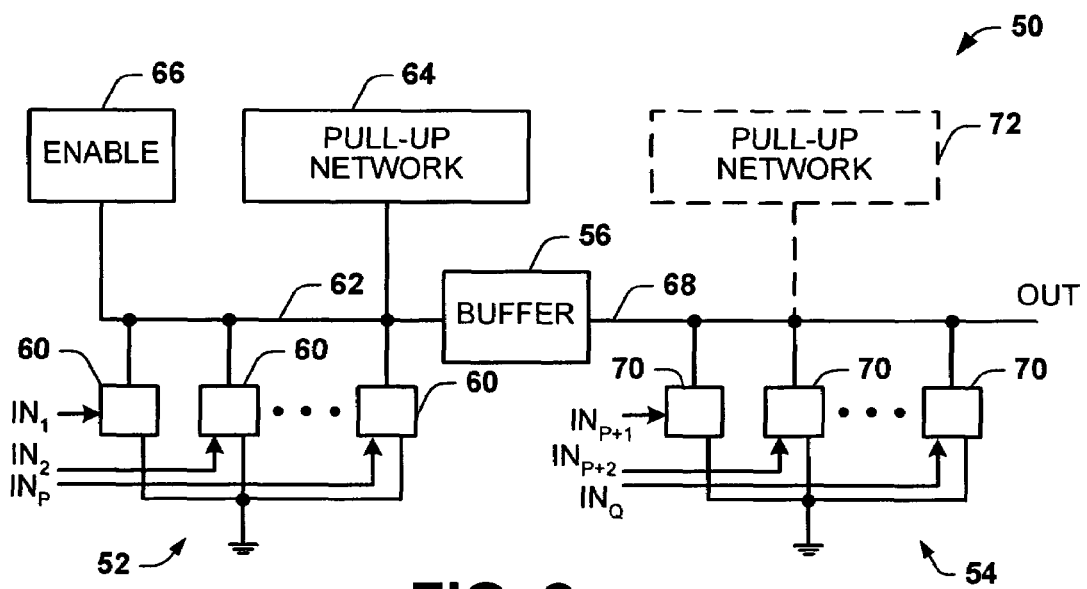
FIG. 2 depicts a schematic block diagram of another embodiment of a multi-stage pseudo dynamic circuit.

FIG. 2 depicts an example of another multi-stage pseudo dynamic circuit system 50. The multi-stage system 50 includes a plurality (e.g., two or more) stages 52 and 54 configured to perform a desired logic function according to a plurality of inputs, indicated respectively at $IN_1$ through $IN_Q$, where Q is a positive integer denoting the number of inputs. The desired logic function can correspond to a logic function that an equivalent single stage network, such as a pseudo dynamic gate, has been designed to perform but performs at a level that is below an expected performance level. For instance, the equivalent single stage network can include a pull-up network that is designed to compensate for leakage through an associated pull-down network; however, because of the amount of leakage, there is significant power leakage through the pull-down network and/or the required size of the pull-up network to compensate for such leakage decreases performance to an unacceptable level.

In the example of FIG. 2, the first stage 52 receives a subset of the Q inputs, including $IN_1$ through $IN_P$, where P is a positive integer denoting the number of inputs received by the first stage 52. A subset of the remaining portion of the Q inputs, including $IN_{P+1}$ through $IN_Q$, are provided as inputs to the second stage 54 of the multi-stage system 50. The first and second stages 52 and 54 cooperate with each other to provide a corresponding output (OUT) according to the plurality of Q inputs. The input signals can be provided from other associated logic circuitry, such as the outputs of a set of exclusive-OR gates arranged to implement a comparison function.

The first stage 52 includes a plurality of pull-down devices 60 that are coupled to an output node 62 of the first stage for implementing part of the desired logic (e.g., combinational logic) function. In the example of FIG. 2, each of the devices 60 can be implemented as a transistor, such as an N-type field effect transistor (NFET). In the example of FIG. 2, each of the pull-down devices are operative to couple the node 62 to electric ground (or other low voltage) based on the respective input signal. At least one pull-down device 60 thus is provided for each of the P inputs in the first stage 52.

The first stage 52 also includes a pull-up network 64 that is operative to pull-up the output node 62 of the first stage. The pull-up network 64 is configured according to the number and sizes (e.g., channel length and width) of the respective pull-down devices 60. The pull-up network 64 is sized, for example, to maintain the output node 62 at a high voltage (e.g., by activating a P-type FET to a steady state ON condition) in the absence of activation of the pull-down devices 60, which further can vary according to the amount of leakage through the respective pull-down devices 60. Since the pull-down network 60 includes only a portion of the pull-down devices relative to an equivalent single stage network (the other portion of the pull-down devices being in the second stage 54), there is a decreased amount of leakage through the pull-down network of the first stage 52 relative to an aggregate pull-down network in the equivalent single stage network. That is, the percentage of PFET size in the pull-up network 64 to total NFET size in the first and second stages can be reduced compared to an equivalent single stage system. Hence, the pull-up network 64 can be configured as a smaller device that the equivalent single stage network. By employing a smaller pull-up network 64 than in the equivalent single stage network, the overall performance (e.g., speed) of the multi-stage system 50 can be increased accordingly.

An enable block 66 can also be associated with the first stage 52 for enabling operation of the first stage, which further can operate as an enable for the multi-stage system 50. The output node 62 of the first stage thus is coupled through the buffer network 56 to drive the second stage 54. For example, since operation of the second stage 54 is dependent upon activation and operation of the first stage 52, which can be controlled via the enable block 66, a reduction in power consumption can be achieved when the first stage does not enable operation of the second stage. That is, since the total number of pull-down devices in the multi-stage network 50 are divided among the stages 52 and 54, there is a decrease in the aggregate amount of leakage in the system 50 when the first stage does not enable the second stage. The decreased leakage results because the drive fighting between pull-up and pull-down networks in the second stage is mitigated when the second stage is not enabled. This can be contrasted with an equivalent single stage system, which (similar to operation of the first stage 52) results in drive fighting and power leakage between the pull-up network and leakage through the pull-down network when the network is enabled.

The buffer 56 interconnects the first stage 52 and second stage 54 for providing the signal at the node 62 to the output node 68 of the second stage 54. The buffer 56 can be tuned to provide high speed operation such as can be implemented by skewing respective portions of the buffer 56 to favor a critical edge of the signal provided at 62. The second stage 54 also includes pull-down devices 70 that implement another portion of the desired logic function according to the second set of the input signals, indicated at $IN_{P+1}$ through $IN_Q$.

An optional pull-up network 72 can be coupled to the node 68 for helping to maintain the voltage at 68 at the desired high level in the absence of activating the pull-down devices 70. Additionally or alternatively, a corresponding component of the buffer 56 can be configured so as to help maintain the voltage at the node 68 to compensate for leakage through the pull-down devices 70. In one example, the total number of pull-down components 60 and 70 in each stage of the multi-stage circuit system 50 can be substantially equal. By utilizing a substantially equal number of pull-down components in each stage, the size of each pull-up network 64, 72 can be substantially minimized, thereby resulting in a corresponding increase in performance.

Figure 3:
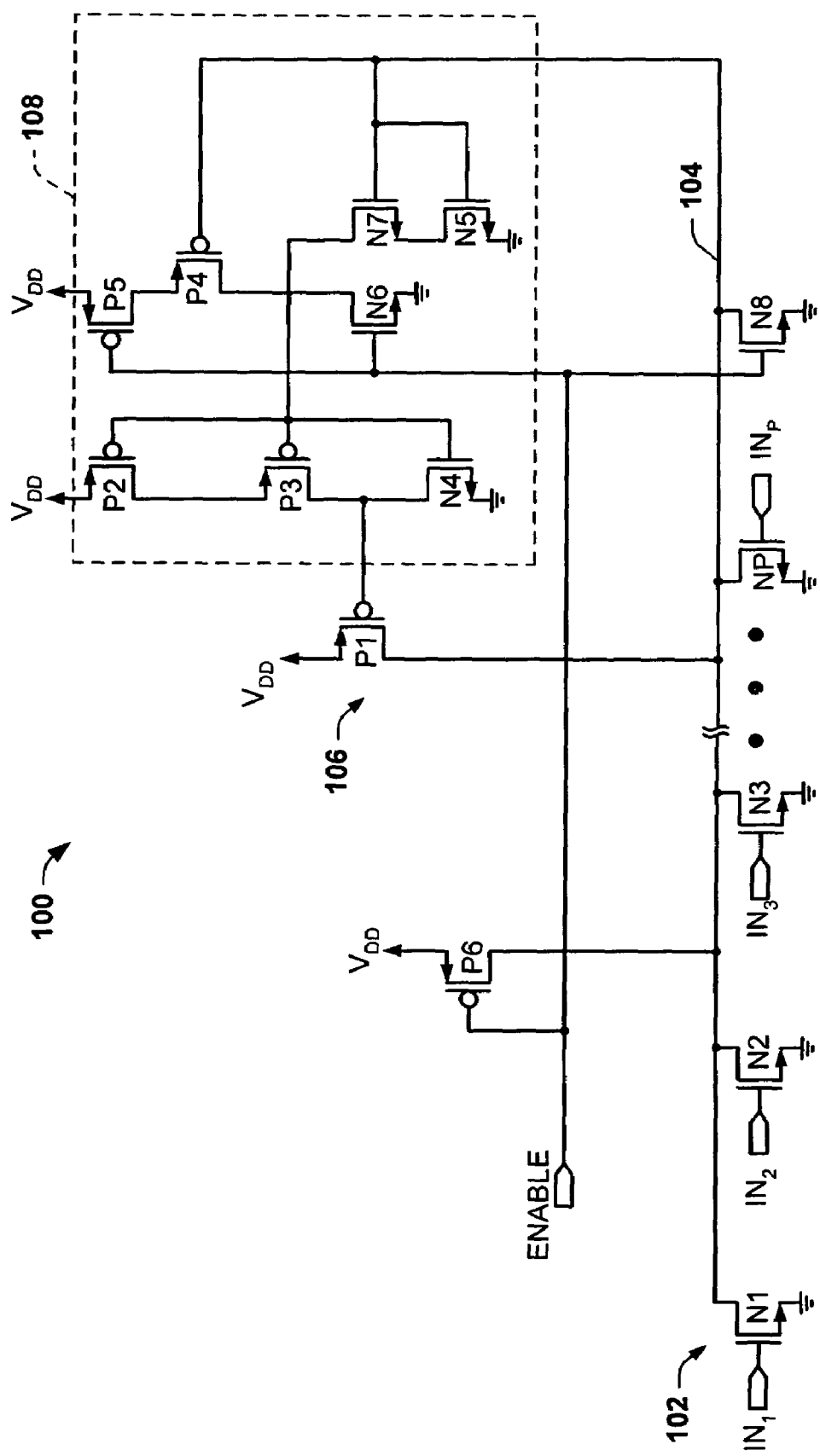
FIG. 3 depicts a circuit diagram of an embodiment of a first stage of a pseudo dynamic circuit.

FIG. 3 depicts an example of pseudo dynamic circuit 100, such as can be utilized to implement a first stage of a multi-stage pseudo dynamic system. The circuit 100 includes a pull-down network 102 that includes a plurality of NFET transistors indicated at N1, N2, N13 through NP, where P is a positive integer (e.g., P>1) denoting the number of transistors in the pull-down network. Each of the transistors N1, N2, N3 through NP of the pull-down network 102 is controlled by a corresponding input signal indicated respectively at $IN_1$, $IN_2$, $IN_3$, and $IN_P$, which are provided to the gates thereof. The pull-down network 102 is coupled between an output node 104 and electrical ground and, thus, is operative to set a logic state at the output node 104 as a function of the respective input signals. In the example of FIG. 3, the transistors N1, N2, N3 and NP are arranged to perform a logic NOR function according to the input signals.

A pull-up network 106 also is coupled to the node 104. The pull-up network 106 is coupled to help maintain the node 104 at a desired high state, (e.g., $V_{DD}$) as a function of the state of the node 104 and an ENABLE signal. The ENABLE signal can be provided as a normally low signal. The ENABLE signal is fed to transistor P6 which is coupled between $V_{DD}$ and the node 104 for activating of the circuit 100 by pulling the node 104 to $V_{DD}$ when the ENABLE signal is low. If the ENABLE signal is high, NFET N8 is activated to pull the node 104 low and thereby disable the circuit 100. The pull-up network 106 can be implemented by a PFET transistor P6 that is operative to pull the node 104 to a high voltage state $V_{DD}$ when the pull-down network 102 is not activated to pull the node low. P6 is sized to supply current to compensate for power leakage through the NFET devices in the pull-down network 102. P1 and P6 can be considered part of the pull-up network for the circuit 100, as P1 is controlled to facilitate transitions at the node 104.

To control P1, a feedback network 108 implements a pseudo NMOS circuit based on the voltage at the node 104 and based on the ENABLE signal. In particular, the node 104 is coupled to gates of transistors N5, N7 and P4. P4 is coupled through P5 to $V_{DD}$ through another NFET N6. The gates of P5 and N6 further are coupled to the ENABLE signal. The feedback network 108 thus provides the control input at the gate of P1, generally operating as a NOR function for controlling P1 based on the ENABLE signal and the voltage at the node 104. As mentioned above, the ENABLE signal also is coupled to the gates of P5 and N6 of the feedback network 108. Accordingly, when the ENABLE signal is low, the circuit 100 is enabled and thus can operate to provide a desired output at the node 104 as a function of the respective input signals provided to the gates of the NFETs of the pull-down network 102.

By way of further example, assuming that the ENABLE signal is low to activate the first stage circuit 100, the feedback network 108 turns P1 on when the PD node 104 is low, and P1 is turned off if the PD node 104 is high. P1 is sized and configured to increase the speed of transitions at the PD node 104. For instance, if the pull-down network 102 is pulling the node 104 to a low voltage (e.g., by activation of one or more of the NFETs), P1 will be activated to pull the node 104 upward so that once the pull-down network stops pulling down, the voltage at the node 104 will rise quickly. If the pull-down network 102 is not pulling down on the node 104, P1 will be disabled so that when the pull-down network starts to pull down on 104, P1 will not be activated to resist (or fight) the transition to the low voltage. The delay through the gates of the feedback network 108 ensures that the node 104 has made most of the transition before P1 is asserted or de-asserted, which helps maintain desired transition speed at the node 104.

Figure 4:
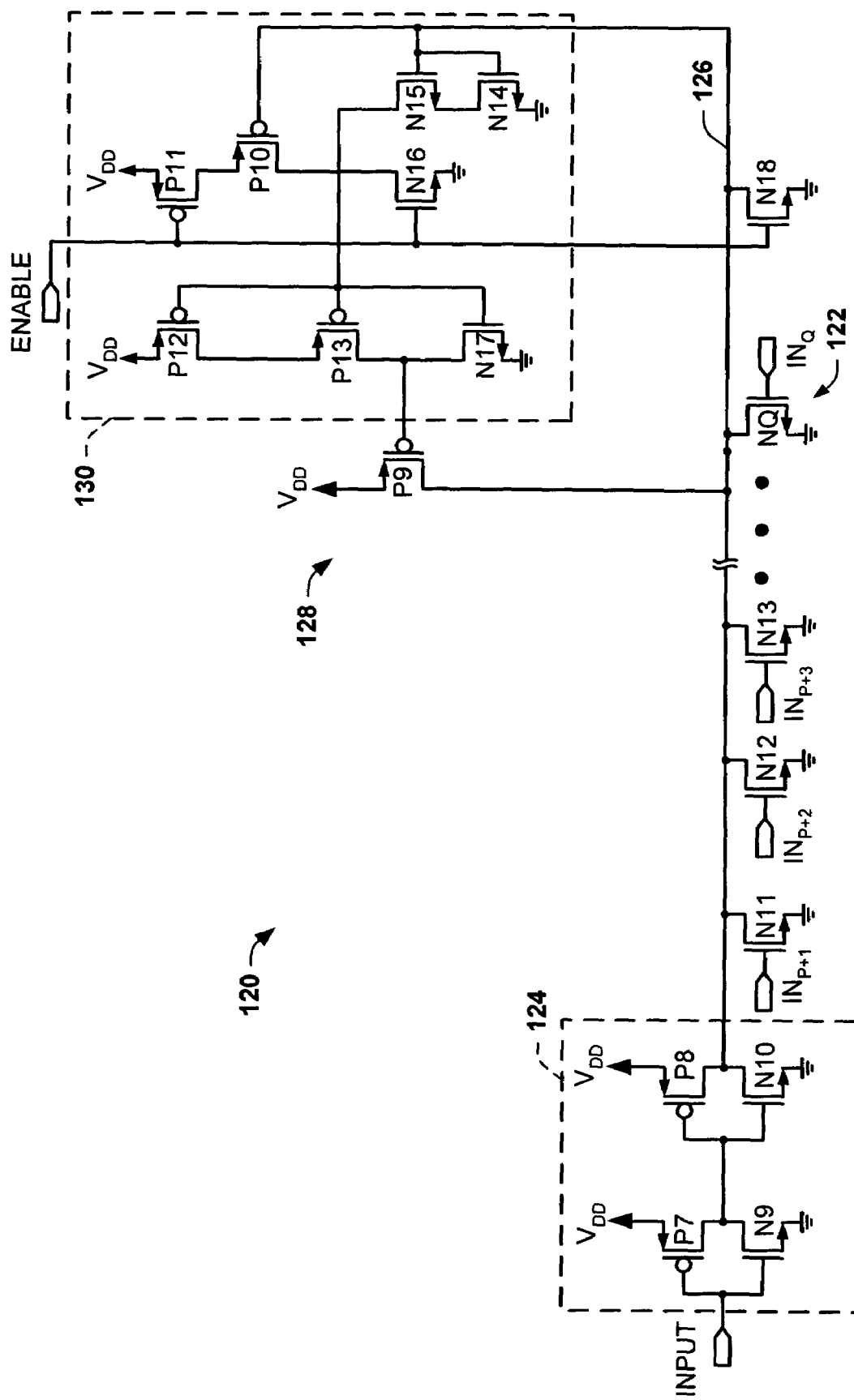
FIG. 4 depicts a circuit diagram of an embodiment of a subsequent stage of a pseudo dynamic circuit.

Those skilled in the art will understand and appreciate that power leakage occurs through the NFETs in the pull-down network 102. The amount of leakage tends to increase as the device densities in a corresponding integrated circuit implementing the circuit 100 continue to increase making the NFETs smaller. Accordingly, to maintain the node 104 at the desired state, P6 generally has to be sufficiently large, which reduces the operating speed of transitions at the node 104. Accordingly, to increase the speed and reduce the power consumption associated with a circuit of the type 100, a substantial portion of NFET devices of an aggregate pull-down network can be divided between the first stage circuit 100 and one or more subsequent stages, as described herein, which can be coupled in series with (or cascaded) with the circuit 100. FIG. 4 depicts an example of a second stage circuit 120 that can be utilized in conjunction with the circuit 100 to provide a multi-stage pseudo-dynamic system.

Referring to FIG. 4, the second stage circuit 120 includes a pull-down network 122 that is coupled to receive an INPUT signal. The INPUT signal can correspond to the signal at the output node 104 of the first stage circuit 100 shown and described with respect to FIG. 3. The INPUT signal is provided to a buffer 124 which includes a pair of inverters coupled for receiving the INPUT signal from a preceding stage of a multi-stage network. One of the inverters includes a PFET P7 that is connected in series with an NFET N9 between $V_{DD}$ and electrical ground, and the other inverter includes PFET P8 and NFET N10, respectively, also connected between $V_{DD}$ and electrical ground. The buffer 124 can be tuned and sized to favor the critical edge provided in the INPUT signal such that the data from a preceding stage can ripple through the buffer from the first stage to the second stage. The INPUT signal thus is transferred to a corresponding output node 126 of the second stage circuit 120.

The pull-down network 122 further is coupled between the output node 126 and electrical ground. The pull-down network is configured for implementing another portion of the desired logic function according to a second portion of input signals indicated at $IN_{P+1}$, $IN_{P+2}$, $IN_{P+3}$ through $IN_Q$, where Q is an integer denoting the total number of inputs to the multi-stage system, and P is the number of input signals to one or more preceding stages. Thus, Q minus P denotes the number of inputs in the second stage circuit 120. In the example of FIG. 3, the pull-down network 122 includes transistors N11, N12, N13 through NQ, each of which receives a respective one of the input signals $IN_{P+1}$, $IN_{P+2}$, $IN_{P+3}$ through $IN_Q$. The aggregate set of Q inputs and corresponding logic circuitry (e.g., NFETs) receiving the inputs to the desired logic function can be divided between the first and second stage circuits. For example, approximately one-half of the inputs and corresponding NFETs can be provided to the first stage circuit (e.g., circuit 100 of FIG. 3) of the multi-stage network and a second half of the inputs and corresponding NFETs can be provided to the second stage circuit 120. As a result, the first and subsequent stage circuits of the multi-stage network cooperate to perform the desired logic (e.g., combinational logic) function, such as was designed into an equivalent single stage network.

The second stage circuit 120 also includes a pull-up network 128 that is coupled between $V_{DD}$ and the node 126 to pull-up the node 126 to $V_{DD}$. The pull-up network 128 thus includes PFET P9 which is controlled based on a control signal provided by a feedback network 130. The feedback network 130 is coupled to drive P9 based on an ENABLE signal and the state of the output node 126. The feedback network of the second stage circuit 120 is depicted to be substantially identical to the feedback network 130 in the first stage circuit 100 of FIG. 3, although different arrangements could also be utilized. Briefly stated, the feedback network 130 includes an arrangement of transistors N14, N15 and P10 that are responsive to the state of the output node 126. Additionally, transistors P11 and N16 are coupled to receive the ENABLE signal. P12, P13 and N17 further are coupled in series between $V_{DD}$ and ground and are responsive to activation of N14 and N15. The feedback network 130 thus operates to facilitate transitions at the node 126 by ensures that a substantial portion of the transition is made before P9 is asserted or de-asserted. The feedback network 130 operates based on the ENABLE signal and the state of the output node 126 for driving and controlling operation of the transistor P9.

Those skilled in the art will appreciate that the second stage circuit 120 does not include an additional pull-up transistor for enabling the second stage 120, as the second stage 120 is enabled based upon the INPUT signal received by the buffer 124. As a result of enabling the second stage circuit 120 based upon the INPUT signal, a significant power reduction can be achieved since drive fighting between the pull-up transistor P9 and the pull-down network 122 is significantly reduced in the absence of the first stage being independently enabled. Additionally, the pull-up transistor P8 is sized to compensate for leakage associated with only the portion of the NFETs in the pull-down network 122. Thus, by dividing an aggregate pull-down network between a plurality of cascaded stages, including the circuit 120 and at least one preceding stage circuit, as described herein, P9 can be implemented as a smaller percentage of the total PFET width that is connected to the node 126. As a result, a multi-stage network incorporating the second stage circuit 120 can exhibit improved performance, including operate at faster speeds and have reduced power leakage, relative to an equivalent single stage network configured to implement the desired logic function.

Figure 5:
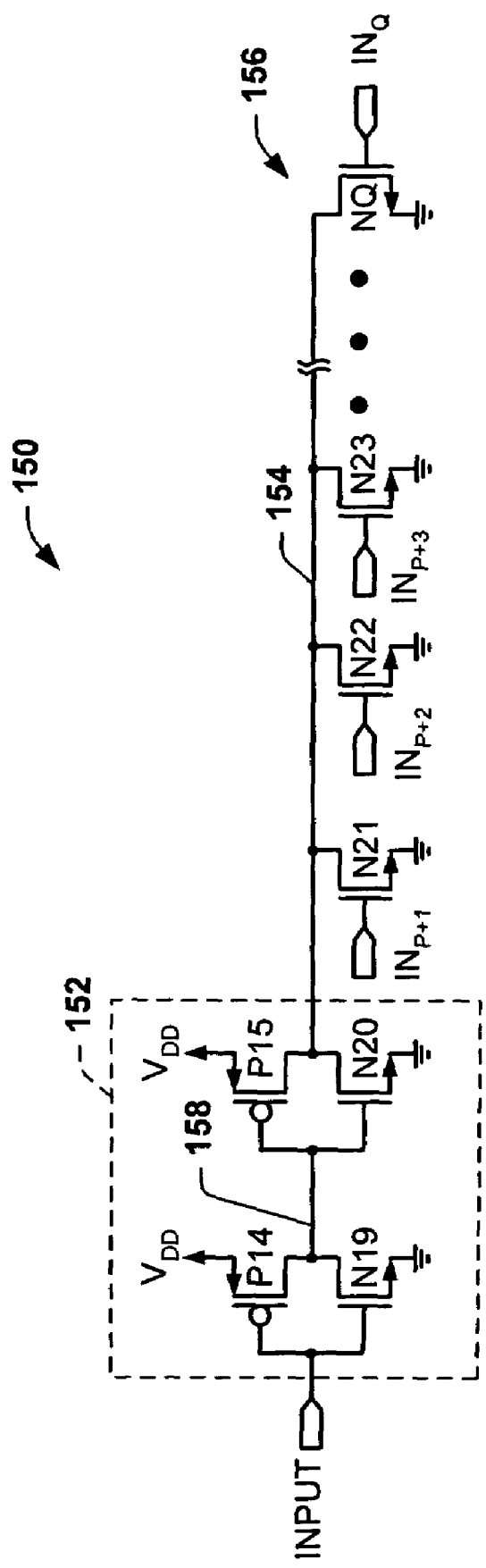
FIG. 5 depicts a circuit diagram of another embodiment of a subsequent stage of a pseudo dynamic circuit.

FIG. 5 depicts an example of another second stage pseudo dynamic gate circuit 150 that can be implemented in conjunction with a preceding stage pseudo dynamic gate circuit, such as the circuit 100 shown and described with respect to FIG. 3. The circuit 150 of FIG. 5 includes an input buffer 152 for receiving an output signal from a preceding stage, which can be substantially similar to the input buffer of FIG. 4. In brief, the input buffer 152 includes a pair of inverters, one of which includes a P14 and N19 and the other includes P15 and P20. The buffer 152 can be tuned and sized to favor the critical edge provided in the INPUT signal such that the INPUT received from the preceding stage can propagate through the buffer to an output node 154 of the second stage.

Additionally, to further reduce the required number of circuit components, a feedback network and separate set pull-up transistor are eliminated from the second stage circuit 150. Instead, P15 of the buffer network 152 can be sized and configured to operate as a pull-up transistor for the output node 154. The circuit 150 also includes a pull-down network 156 coupled to the node 154. That is, P15 can be sized to, when enabled by an INPUT signal from a preceding stage, compensate for leakage through a plurality of NFETs N20, N21, N22, N23 and NQ that are coupled to the output node 154. Each of the NFETs receives a corresponding input signal indicated respectively at $IN_{P+1}$, $IN_{P+2}$, $IN_{P+3}$, and $IN_Q$, where Q is a positive integer, Q>P, and where Q–P denotes the number of inputs received by the second stage pull down network. The NFETs are arranged to perform a portion of a desired logic function, which cooperates with at least one preceding stage to perform the complete logic function, such as a wide-OR function, wide-NOR function or other combinational logic on the total number of Q inputs provided to the multi-stage network.

In this way, similar to the second stage circuit 120 of FIG. 4, the second stage circuit 150 is enabled based upon the INPUT signal received from a previous stage. By enabling the second stage circuit 120 according to the INPUT signal, a substantial power reduction can be achieved as the drive fighting between the pull device P15 and the pull-down network 156, is mitigated and limited to those situations in which the INPUT signal is active (e.g., high voltage state) to enable the second stage circuit 150.

Additionally, the second stage circuit 150 helps reduce wire count associated with implementing the second stage circuit, further resulting in increased performance relative to many existing designs. When implementing the second stage circuit 150, the delay associated with the buffers 152 can be balanced with the increased speed that results from reducing the size of the PFET P15 that operates to help pull-up the output node 154. Additionally, when the second stage circuit 150 is cascaded together with a first stage circuit, such as the circuit 100 of FIG. 3, if the INPUT signal from a preceding stage is low, the second stage circuit 150 and, all later stages are turned off based upon the INPUT signal since the INPUT signal operates to enable and disable the second stage circuit 150. Consequently, when the second stage circuit 150 is disabled, drive fighting does not occur between P15 and the pull-down network 156, which further helps to conserve power.

As an example, assuming that the preceding stage is enabled, if the P inputs provided to the pull-down network of the preceding stage are low, the INPUT signal from a preceding stage will be high. Accordingly, an input node 158 to the second inverter of the buffer is low and P15 is turned on to pull the output node 154 high. By way of further example, the plurality of NFETs of the multi-stage network can be driven by an arrangement of exclusive-OR gates that provide the input signals to the desired logic function, such as for implementing comparison or matching functions or other combinational logic.

Figure 6:
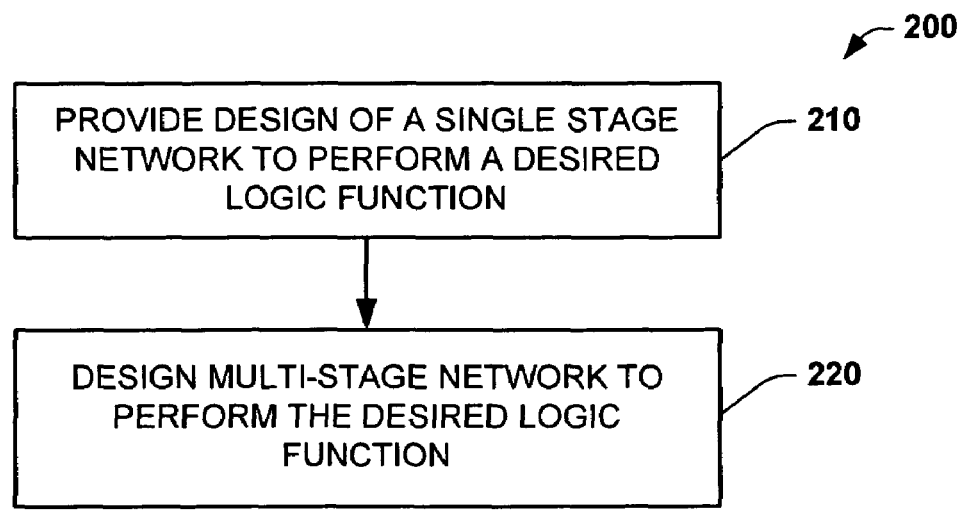
FIG. 6 is a flow diagram depicting an embodiment of a method.
Figure 7:
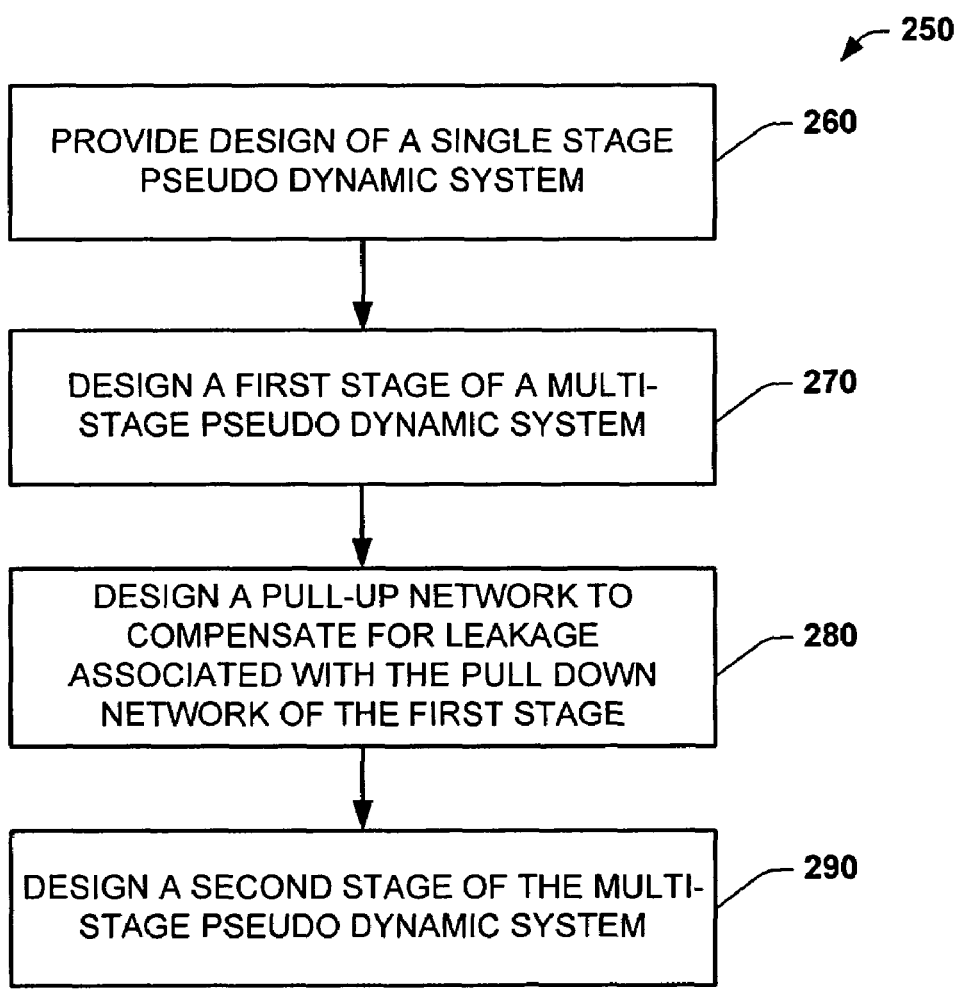
FIG. 7 is a flow diagram depicting another embodiment of a method.
Figure 8:
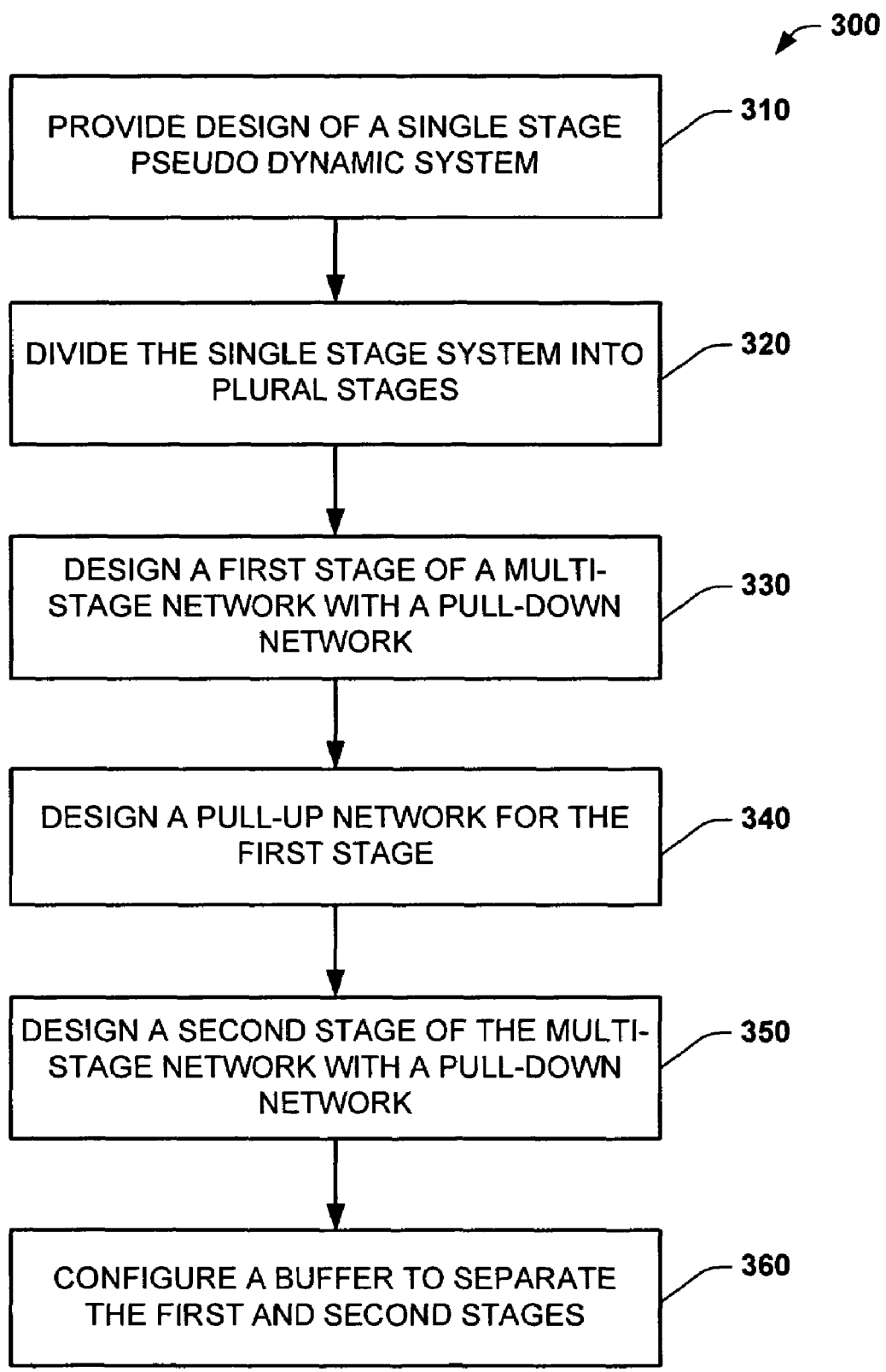
FIG. 8 is a flow diagram depicting yet another embodiment of a method.

In view of the foregoing structural and functional features described above, certain methods will be better appreciated with reference to FIGS. 6, 7 and 8. It is to be understood and appreciated that the illustrated actions, in other embodiments, may occur in different orders and/or concurrently with other actions. Moreover, not all illustrated features may be required to implement a method. It is to be further understood that the following methods can be implemented by one or more designers manually or through the use of a computer-aided design (CAD) tool running executable instructions operative to perform a portion of the method utilized to determine the design.

FIG. 6 depicts a design method 200 for a dynamic circuit system. The method 200 may include providing a design for a single stage network comprising a pull-down network that is configured to perform a desired logic function according to a plurality of inputs, as shown at 210. The method may also include designing a multi-stage network that includes at least two stages, each of the at least two stages including a pull-down network that receives a respective portion of the plurality of inputs and each of the at least two stages cooperating to perform the desired logic function, as shown at 220.

FIG. 7 depicts a design method 250 for designing a pseudo dynamic circuit. At 260, the method 250 includes providing a design of a single stage pseudo dynamic system that includes a pull-up network coupled to an output node and a pull-down network coupled to the output node. The pull-down network is configured to perform a logic function and provide an output according to a plurality of inputs. The method also includes designing a first stage of a multi-stage pseudo dynamic system that includes a first pull-down network configured to provide a corresponding output at an output node thereof based on a first portion of the plurality of inputs, as shown at 270. At 280, the method includes designing a pull-up network to compensate for leakage associated with the pull-down network of the first stage, such that a ratio of size for the pull-up network of at least the first stage to size of the pull-down network of the at least the first stage is reduced relative to a ratio of size for the pull-up network of the single stage network to size of the pull-down network of the single stage network. At 290, a second stage of the multi-stage pseudo dynamic system is designed to include a second pull-down network configured to provide a corresponding output at an output node thereof based on the output at the output node of the first stage and a second portion of the plurality of inputs, such that the output of the second stage corresponds to the output of the single stage-pseudo-dynamic system.

FIG. 8 depicts an example of a method 300 that can be utilized to design a multi-stage pseudo dynamic circuit system that performs a desired logic function with improved performance relative to an equivalent single stage system capable of performing the desired logic function. The method 300 begins at 310 in which a design of a single stage pseudo dynamic system is provided. The design can be provided in printed or an electronic format, such as by a corresponding design tool. The single stage system includes a pull-up network coupled to an output node and a pull-down network coupled to the output node. The pull-down network is configured to perform a desired logic function (e.g., a wide-OR, a wide-NOR or other combinational logic) and provide an output according to a plurality of inputs.

Those skilled in the art will appreciate that due to increased device densities in many integrated circuits, the components (e.g., NFETs) in the pull-down network exhibit a substantial amount of leakage because of their reduced channel lengths. Consequently, the pull-up network has to be sufficiently large to compensate for the leakage, which results in reduced performance (e.g., speed) of the single stage system. For instance, for a given process, for every NFET pulling down an output node of the single stage system, a corresponding PFET is required to increase in size proportional to the number of NFETs.

At 320, the single stage system is divided into plural stages to provide a multi-stage pseudo dynamic system. The multi-stage system is operative to perform the same logic function as the equivalent single stage system according to the same plurality of inputs. At 330, a first stage of a multi-stage system is designed to include a pull-down network. The designing can be performed by one or more designers employing any design means, such as an appropriate CAD tool or manually. The pull-down network of the first stage can be configured to provide a corresponding output at an output node based on a first portion of the plurality of inputs.

At 340, a pull-up network is designed to compensate for leakage associated with the pull-down network of the first stage. Since the pull-down network includes a portion of the total number of pull-down devices (e.g., NFETs) of the equivalent, the pull-up network of the first stage can be designed with a reduced size relative to the pull-up network of the single stage network. For example, the size of a corresponding PFET in the pull-up network of the first stage is sized as a function of a fractional part (e.g., as a percentage, which varies for a given process) of the NFETs implementing the desired logic function in the first stage. Another part of the total number of NFETs, which implement the remaining portion of the logic function, are provided in one or more subsequent stages (described below at 350). Since the PFET of the first stage is sized according to the fractional part (e.g., about one-half) of the NFETs, the performance of the multi-stage network (despite the additional components and use of a buffer to separate successive stages) can be improved when compared to the equivalent single stage system.

At 350, a second stage of the multi-stage pseudo dynamic system is designed to include a second pull-down network. The pull-down network includes another fractional part of the pull-down components, which are configured to provide a corresponding output at an output node thereof based on the output from the first stage and a second portion of the plurality of inputs. For the example of a two-stage system, the pull-down network of the first stage and the pull-down network of the second stage cooperate to implement the desired logic function (e.g., a wide-OR, a wide-NOR or other combinational logic). That is, the output of the second stage corresponds to the output of the single stage-pseudo-dynamic circuit based on the plurality of inputs.

At 360, a buffer network is configured to separate the first and second stages. In one example, an output portion (e.g., a PFET) of the buffer network can be designed as pull-up or keeper that substantially compensates for leakage through the pull-down network of a second of the at least two stages when the second stage is activated. Those skilled in the art will understand and appreciate that the buffer network couples the output of the first stage with the output of the second stage so as to enable operation (or activate) of the second stage in the absence of a clock signal. This facilitates a further reduction in power consumption when the second stage is not enabled. The designing (e.g., at 330, 340 and 350) can be performed by employing any circuit design means, such as including a computer running an appropriate CAD tool, manually or a combination thereof.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A method for fabricating a circuit, comprising:
   fabricating a single stage network comprising a pull-down network that is configured to perform a desired logic function according to a plurality of inputs; and
   fabricating a multi-stage network that includes at least two stages, each of the at least two stages including a pull-down network that receives a respective portion of the plurality of inputs and each of the at least two stages cooperating to perform the desired logic function according to the plurality of inputs, wherein the single stage network includes a pull-up network to substantially compensate for leakage of current associated with the pull-down network of the single stage network; and
   fabricating a pull-up network to substantially compensate for leakage associated with the pull-down network of a first stage of the at least two stages, such that a ratio of size for the pull-up network of at least the first stage to size of the pull-down network of at least the first stage is reduced relative to a ratio of size for the pull-up network of the single stage network to size of the pull-down network of the single stage network.

2. The method of claim 1, wherein the size of the pull-up network of the first stage of the multi-stage network is based on the respective portion of the plurality of inputs received by the pull-down network of the first stage of the multi-stage network.

3. The method of claim 1, further comprising providing a pull-up network in a second stage of the at least two stages to substantially compensate for leakage through the pull-down network of the second stage, such a ratio of size for the pull-up network of at least the first stage to size of the pull-down network of at least the first stage is reduced relative to a ratio of size for the pull-up network of the single stage network to size of the pull-down network of the single stage network.

4. A method for fabricating a circuit, comprising:
   fabricating a single stage pseudo dynamic system that includes a pull-up network coupled to an output node and a pull-down network coupled to the output node, the pull-down network being configured to perform a logic function and provide an output according to a plurality of inputs;
   fabricating a first stage of a multi-stage pseudo dynamic system that includes a first pull-down network configured to provide a corresponding output at an output node thereof based on a first portion of the plurality of inputs;
   fabricating a pull-up network to compensate for leakage of current associated with the pull-down network of the first stage, such that a ratio of size for the pull-up network of at least the first stage to size of the pull-down network of the at least the first stage is reduced relative to a ratio of size for the pull-up network of the single stage network to size of the pull-down network of the single stage network; and
   fabricating a second stage of the multi-stage pseudo dynamic system that includes a second pull-down network configured to provide a corresponding output at an output node thereof based on the output at the output node of the first stage and a second portion of the plurality of inputs, such that the output of the second stage corresponds to the output of the single stage-pseudo-dynamic system.

5. The method of claim 4, further comprising separating the first and second stages with a buffer network.

6. The method of claim 5, wherein an output portion of the buffer network is designed to substantially compensate for leakage of current through the pull-down network of the second stage.

7. The method of claim 5, wherein the output of the first stage is coupled through the buffer network to enable operation of the second stage in the absence of a clock signal to enable the second stage.

8. The method of claim 4, wherein each of the pull-down networks of the first and second stages further comprises an arrangement of transistors arranged to perform a respective part of the desired logic function, such that the output of the second stage provides a result that is equivalent to the output of the single stage pseudo dynamic system according to the plurality of inputs.

9. The method of claim 8, wherein the arrangement of transistors of the first stage further comprises N-type field effect transistors coupled between the output node of the first stage and a low voltage or ground potential, and the arrangement of transistors of the second further comprises N-type field effect transistors coupled between the output node of the second stage and the low voltage or the ground potential.

10. The method of claim 9, further comprising:
    sizing at least one P-type field effect transistor in the pull-up network of the first stage to pull-up the output node of the first stage to substantially compensate for leakage of current associated with the pull-down network of the first stage; and
    configuring at least one P-type field effect transistor that is coupled to pull-up the output node of the second stage and that is sized to substantially compensate for leakage of current associated with the pull-down network of the second stage.

11. The method of claim 4, wherein the desired logic function implemented by the multi-stage network comprises one of a wide OR function and a wide NOR function according to the plurality of inputs.

12. A system for designing a circuit, comprising:
    means for providing a design of a single stage pseudo dynamic system that includes a pull-up network coupled to an output node and a pull-down network coupled to the output node, the pull-down network being designed to perform a logic function and provide an output according to a plurality of inputs;

means for designing a first stage of a multi-stage pseudo dynamic system that includes a first pull-down network designed to provide a corresponding output at an output node thereof based on a first portion of the plurality of inputs;

means for designing a pull-up network to compensate for leakage of current associated with the pull-down network of the first stage, such that a ratio of size for the pull-up network of at least the first stage to size of the pull-down network of the at least the first stage is reduced relative to a ratio of size for the pull-up network of the single stage network to size of the pull-down network of the single stage network; and means for designing a second stage of the multi-stage pseudo dynamic system that includes a second pull-down network designed to provide a corresponding output at an output node thereof based on the output at the output node of the first stage and a second portion of the plurality of inputs, such that the output of the second stage corresponds to the output of the single stage-pseudo-dynamic system.

13. A method for fabricating a circuit, comprising:

fabricating a single stage network comprising a pull-down network that is coupled between an output node and ground, the pull-down network being configured to perform a desired logic function according to a plurality of input signals, each of the plurality of input signals being provided to a respective different input of a plurality of inputs, the plurality of input signals being in addition to the ground; and fabricating a multi-stage network that includes at least two stages, each of the at least two stages including a pull-down network that receives a respective portion of the plurality of input signals at each of a respective portion of the plurality of inputs and each of the at least two stages cooperating to perform the desired logic function according to the plurality of input signals at each of the respective plurality of inputs;

wherein the single stage network is a single stage pseudo dynamic circuit and wherein the multi-stage network is a multi-stage pseudo dynamic circuit, the single stage pseudo dynamic-circuit including a pull-up network to substantially compensate for leakage of current associated with the pull-down network of the single stage network, the method further comprising designing a pull-up network to substantially compensate for leakage of current associated with the pull-down network of a first stage of the at least two stages, such that a ratio of size for the pull-up network of at least the first stage to size of the pull-down network of at least the first stage is reduced relative to a ratio of size for the pull-up network of the single stage network to size of the pull-down network of the single stage network.

* * * * *

UNITED STATES PATENT AND TRADEMARK OFFICE
CERTIFICATE OF CORRECTION

PATENT NO.        : 7,698,673 B2                                               Page 1 of 1
APPLICATION NO.   : 10/940703
DATED             : April 13, 2010
INVENTOR(S)       : Steven Ray Affleck et al.

It is certified that error appears in the above-identified patent and that said Letters Patent is hereby corrected as shown below:

On the Title Page, Item (75), Inventors, line 1, delete "Steven Ray Afleck" and insert
-- Steven Ray Affleck --, therefor.

Signed and Sealed this

Third Day of August, 2010

David J. Kappos
*Director of the United States Patent and Trademark Office*